US011143716B2

(12) United States Patent
Nobutaka et al.

(10) Patent No.: US 11,143,716 B2
(45) Date of Patent: Oct. 12, 2021

(54) HIGH-VOLTAGE POWER SOURCE DEVICE AND NOTIFICATION METHOD

(71) Applicant: NEC Platforms, Ltd., Kawasaki (JP)

(72) Inventors: Yasushi Nobutaka, Kanagawa (JP); Kunihiko Endoh, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 188 days.

(21) Appl. No.: 16/466,721

(22) PCT Filed: Dec. 8, 2017

(86) PCT No.: PCT/JP2017/044199
§ 371 (c)(1),
(2) Date: Jun. 5, 2019

(87) PCT Pub. No.: WO2018/110453
PCT Pub. Date: Jun. 21, 2018

(65) Prior Publication Data
US 2020/0064393 A1    Feb. 27, 2020

(30) Foreign Application Priority Data

Dec. 13, 2016    (JP) .............................. JP2016-241440

(51) Int. Cl.
G01R 31/11    (2006.01)
G01R 31/58    (2020.01)
(Continued)

(52) U.S. Cl.
CPC ........... *G01R 31/58* (2020.01); *G01R 31/008* (2013.01); *G01R 31/088* (2013.01); *G01R 31/11* (2013.01);
(Continued)

(58) Field of Classification Search
CPC ...... G01R 31/11; G01R 31/58; G01R 31/088; G01R 31/008; H04B 3/46; H04B 2203/5458; A01M 29/24; G05F 1/10
(Continued)

(56) References Cited

U.S. PATENT DOCUMENTS

2013/0110430 A1* 5/2013 Nishi .................... G01R 31/382
  702/63
2013/0320991 A1* 12/2013 Kiuchi ................. G01R 31/392
  324/434
(Continued)

FOREIGN PATENT DOCUMENTS

JP    61-139218 A    6/1986
JP    6-225680 A    8/1994
(Continued)

OTHER PUBLICATIONS

Communication from Japanese Patent Office for Japanese Patent Application No. 2016-241440 dated Apr. 10, 2019.
(Continued)

Primary Examiner — Raul J Rios Russo
(74) Attorney, Agent, or Firm — Sughrue Mion, PLLC

(57) ABSTRACT

A high-voltage power source device includes: a first terminal connected to a first end of an electrical wire disposed around a predetermined region; a second terminal connected to a second end of the electrical wire; a high-voltage generation circuit connected to the first terminal and generating high-voltage electricity; a voltage detection circuit connected to the second terminal, and measuring a voltage value of the
(Continued)

high-voltage electricity at the second terminal and determining presence of an abnormality in the electrical wire, based on a measured voltage value; a timing circuit instructing the high-voltage generation circuit to generate high-voltage electricity at a timing when the high-voltage electricity is generated, and sending an instruction to measure a voltage value of the high-voltage electricity at the second terminal to the voltage detection circuit; and a notification circuit for notifying a determination result of the voltage detection circuit to outside.

10 Claims, 15 Drawing Sheets

(51) Int. Cl.
*G01R 31/08* (2020.01)
*G01R 31/00* (2006.01)
*A01M 29/24* (2011.01)
*H04B 3/46* (2015.01)

(52) U.S. Cl.
CPC ............... *A01M 29/24* (2013.01); *H04B 3/46* (2013.01); *H04B 2203/5458* (2013.01)

(58) Field of Classification Search
USPC .................................. 324/500, 512, 533, 534
See application file for complete search history.

(56) References Cited

U.S. PATENT DOCUMENTS

| | | | | |
|---|---|---|---|---|
| 2014/0334051 | A1* | 11/2014 | Yagyu | H02H 9/02 |
| | | | | 361/93.1 |
| 2018/0041027 | A1* | 2/2018 | Matsuda | G01R 31/50 |
| 2019/0222049 | A1* | 7/2019 | Zhang | H02J 7/00714 |
| 2019/0331305 | A1* | 10/2019 | Xiong | F21K 9/272 |

FOREIGN PATENT DOCUMENTS

| | | | |
|---|---|---|---|
| JP | 2006-174703 | A | 7/2006 |
| JP | 2007-121102 | A | 5/2007 |
| JP | 2009-204456 | A | 9/2009 |
| JP | 3073508 | | 9/2009 |
| JP | 2011-72300 | A | 4/2011 |
| JP | 2012-85612 | A | 5/2012 |
| JP | 5458433 | B | 1/2014 |
| JP | 2014-131494 | A | 7/2014 |
| JP | 2015-507459 | A | 3/2015 |
| JP | 57-94383 | U | 8/2015 |
| JP | 2016-90258 | A | 5/2016 |

OTHER PUBLICATIONS

Written Opinion dated Mar. 6, 2018 from the International Bureau in counterpart International Application No. PCT/JP2017/044199.
International Search Report from the International Application No. PCT/JP2017/044199, dated Mar. 6, 2018.

* cited by examiner

Fig. 12

| TERMINAL | \multicolumn{9}{c}{TIME} |
| --- | --- | --- | --- | --- | --- | --- | --- | --- | --- |
| | 1 | 2 | 3 | 4 | 5 | 6 | 7 | 8 | 9 |
| A | H | R | H | H | R | H | H | R | H |
| B | H | H | R | H | H | R | H | H | R |
| C | R | H | H | R | H | H | R | H | H |

Fig.13

| TERMINAL | 1 | 2 | 3 | 4 | 5 | 6 | 7 | 8 | 9 |
|---|---|---|---|---|---|---|---|---|---|
| A | H | – | R | H | – | R | H | – | R |
| B | R | H | – | R | H | – | R | H | – |
| C | – | R | H | – | R | H | – | R | H |
| FLOW | AY-YB | BY-YC | CY-YA | AY-YB | BY-YC | CY-YA | AY-YB | BY-YC | CY-YA |

Fig. 14

| TERMINAL | \multicolumn{9}{c}{TIME} |
| --- | --- | --- | --- | --- | --- | --- | --- | --- | --- |
| | 1 | 2 | 3 | 4 | 5 | 6 | 7 | 8 | 9 |
| A | H | R | R | H | R | R | H | R | R |
| B | R | H | R | R | H | R | R | H | R |
| C | R | R | H | R | R | H | R | R | H |

HIGH-VOLTAGE POWER SOURCE DEVICE AND NOTIFICATION METHOD

This application is a National Stage Entry of PCT/JP2017/044199 filed on Dec. 8, 2017, which claims priority from Japanese Patent Application 2016-241440 filed on Dec. 13, 2016, the contents of all of which are incorporated herein by reference, in their entirety.

TECHNICAL FIELD

The present invention relates to a high-voltage power source device for applying high-voltage electricity to an electrical wire, and a notification method for notifying a state of the electrical wire to which the high-voltage electricity is applied.

BACKGROUND ART

In agriculture and forestry, damage by wild animals, such as boars or deer, eating crops has been increasing. In order to prevent wild animals from entering a farmland, electric fences that are applied a high voltage surround around an outer periphery of the farmland in some cases. A wild animal that touches the electrical wire to which the high voltage is applied is surprised by an electrical shock and then escapes without entering the farmland surrounded by the electric fences.

PTL 1 discloses an electric fence control device that detects current flowing to the ground through an electric fence from a capacitor in which high-voltage energy generated and accumulated by a high-voltage generation circuit, and controls charging of the capacitor depending on a detected current value.

In practice, since electric fences surrounds a farmland or a mountainous area, weeds are grown and come in contact with each conductor, and each conductor contacts with the ground through a fallen tree or a fallen branch, which may cause electrical leakage or disconnection in the electric fence. When electrical leakage or disconnection occurs in the conductor constituting the electric fence, a voltage applied to the conductor decreases, and therefore, an effect of preventing wild animals from entering a farmland deteriorates.

PTL 2 discloses an electrical leakage display device for an electric fence device having a configuration in which a rapid current is caused to flow to a primary side of an output transformer and a high-voltage is acquired at a secondary side of the output transformer. The device in PTL 2 detects the current flowing to the primary side of the output transformer, transforms the current to a signal amount, and causes a light-emitting element to emit light based on the signal amount, thereby displaying the electrical leakage.

PTL 3 discloses a voltage measurement device for an electric fence that measures voltage between an earth terminal and a measurement terminal connected to a predetermined position of an electrical wire constituting an electric fence, and transmits a measurement voltage and a measurement time depending on the measured voltage value.

CITATION LIST

Patent Literature

[PTL 1] Japanese Patent No. 5458433
[PTL 2] Japanese Unexamined Patent Application Publication No. S61-139218
[PTL 3] Japanese Unexamined Patent Application Publication No. 2014-131494

SUMMARY OF INVENTION

Technical Problem

The electrical wire of the electric fence controlled by the electric fence control device in PTL 1 includes no terminal that receives high-voltage electricity, and only a circuit including a ground terminal and a terminal for supplying high-voltage electricity. Accordingly, disconnection or electrical leakage of the electrical wire cannot be detected, and thus it is necessary to periodically check the electric fence and visually check an abnormal location.

According to the device in PTL 2, it is possible to monitor electrical leakage of the electric fence device by using light emission of the light-emitting element. However, the device in PTL 2 is required to check whether electrical leakage occurs by monitoring the light-emitting element. Accordingly, it is necessary to periodically check the electric fence. Further, the device in PTL 2 can monitor occurrence of electrical leakage of the electric fence device, but the device has a problem that a location in a fence wire where the electrical leakage occurs cannot be identified.

According to the device in PTL 3, a decrease in voltage at a predetermined position of the electrical wire constituting the electric fence can be measured, and thus a location in the electrical wire where an abnormality occurs can be identified. However, the device in PTL 3 needs to be disposed at each predetermined position of the electrical wire, which causes a problem that the number of devices, a communication capacity, and the like required for monitoring a single electric fence increase.

In order to solve the above-described problems, an object of the present invention is to provide a high-voltage power source device capable of detecting a status of an abnormality occurs in an electric wire disposed around a predetermined region, and notifying an external device of the status of the abnormality occurs.

Solution to Problem

A high-voltage power source device according to an aspect of the present invention includes: a first terminal connected to a first end of an electrical wire disposed around a predetermined region; a second terminal connected to a second end of the electrical wire; a high-voltage generation circuit being connected to the first terminal and configured to generate high-voltage electricity; a voltage detection unit that measures a voltage value of the high-voltage electricity at the second terminal, and determining whether an abnormality is present in the electrical wire, based on the measured voltage value, the voltage detection unit being connected to the second terminal; a timing circuit configured to instruct the high-voltage generation circuit to generate high-voltage electricity at a timing when the high-voltage electricity is generated, and to send an instruction to measure a voltage value of the high-voltage electricity at the second terminal to the voltage detection unit; and a notification unit that notifies an external device of a determination result of the voltage detection unit.

A notification method according to another aspect of the present invention includes: applying high-voltage electricity from a first terminal side connected to a first end of an electrical wire disposed around a predetermined region; measuring a voltage value at a second terminal connected to a second end of the electrical wire; determining whether an abnormality is present in the electrical wire, based on a measured voltage value; and notifying an external device of a determination result.

Advantageous Effects of Invention

According to the present invention, it is possible to provide a high-voltage power source device capable of detecting a status of an abnormality occurs in an electric wire disposed around a predetermined region, and notifying an external device of the status of the abnormality occurs.

BRIEF DESCRIPTION OF DRAWINGS

FIG. 12 is an example of a table illustrating transitions of output and reception states of a voltage at each terminal included in the notification system according to the fourth example embodiment of the present invention;

FIG. 13 is another example of the table illustrating transitions of output and reception states of the voltage at each terminal included in the notification system according to the fourth example embodiment of the present invention;

FIG. 14 is still another example of the table illustrating transitions of output and reception states of the voltage at each terminal included in the notification system according to the fourth example embodiment of the present invention.

EXAMPLE EMBODIMENT

Figure 1:
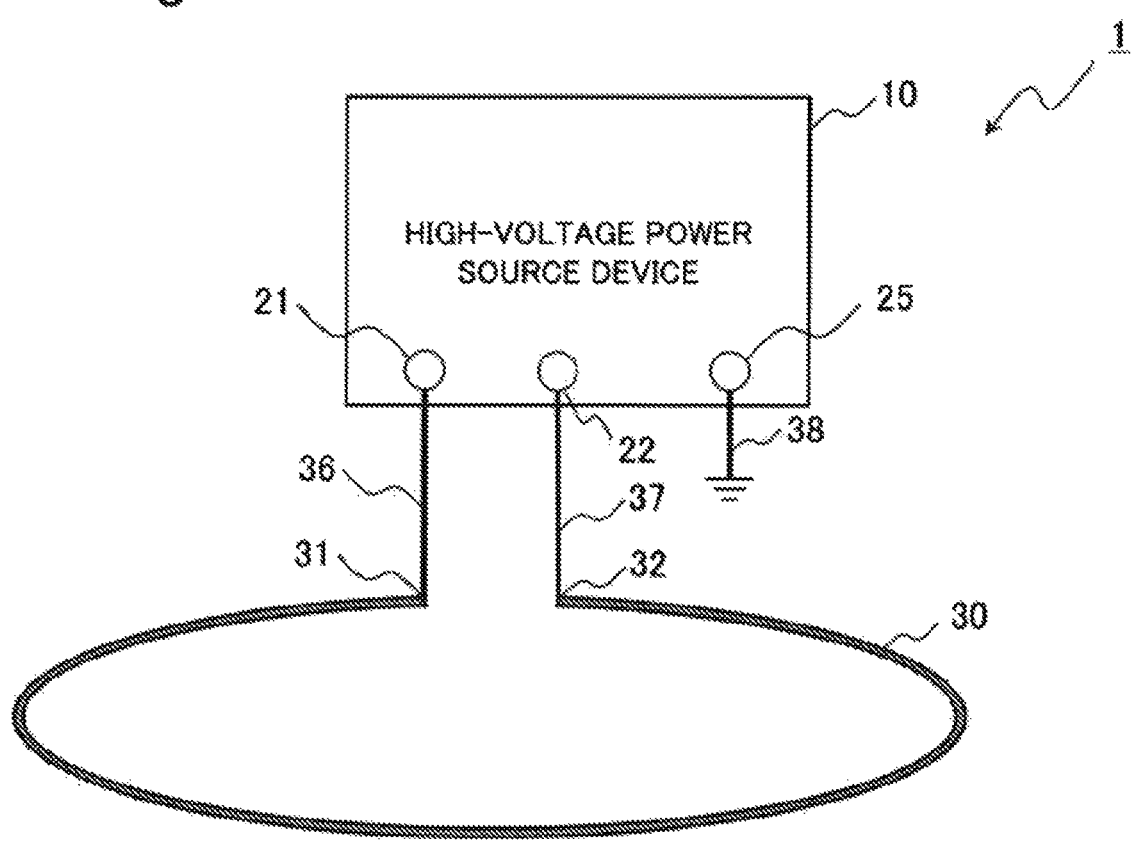
FIG. 1 is a conceptual diagram illustrating a configuration of a notification system according to a first example embodiment of the present invention.

Modes for carrying out the present invention will be described below by using the drawings. Although technically preferable limitations for carrying out the present invention are made in the following example embodiments, the scope of the invention is not limited to the followings. Note that throughout the drawings used to describe the following example embodiments, unless explicitly specified otherwise, like elements are denoted by like reference numerals. In addition, in the following example embodiments, repeated descriptions of similar components and operations may be omitted in some case.

First Example Embodiment

First, a configuration of a notification system according to a first example embodiment of the present invention will be described with reference to the drawings. FIG. 1 is a block diagram illustrating a configuration of a notification system 1 according to this example embodiment. As illustrated in FIG. 1, the notification system 1 according to this example embodiment includes a high-voltage power source device 10 and an electrical wire 30. In this example embodiment, it is assumed that the electrical wire 30 constitutes an electric fence for preventing a living organism, such as an animal, from entering a predetermined region, and does not contact the ground during a normal time. Note that the electrical wire 30 may constitute a structure that is not called an electric fence.

The high-voltage power source device 10 is a device for applying high-voltage electricity to the electrical wire 30 for preventing a living organism, such as an animal, from entering a predetermined region. As the high-voltage electricity generated by the high-voltage power source device 10, a voltage is applied to such an extent that an electrical shock is given to the living organism that has touched the electrical wire 30. For example, the high-voltage power source device 10 applies high-voltage electricity of a voltage exceeding 650 V and less than or equal to 7000 V to the electrical wire 30. More preferably, for example, the high-voltage power source device 10 applies the high-voltage electricity exceeding 1000 V to the electrical wire 30.

The high-voltage power source device 10 is electrically connected to at least one end of the electrical wire 30, and functions as a power source that applies high-voltage electricity to the electrical wire 30. Further, the high-voltage power source device 10 is electrically connected to the electrical wire 30, and measures the voltage to be applied to the electrical wire 30 to thereby detect an abnormality.

Upon detecting that an abnormality has occurred in the electrical wire 30, the high-voltage power source device 10 notifies an external device, such as a higher-order system, of the occurrence of the abnormality in the electrical wire 30 via a network, which is not illustrated.

The high-voltage power source device 10 includes an output terminal 21 (also referred to as a first terminal) for applying high-voltage electricity to the electrical wire 30, a receiving terminal 22 (also referred to as a second terminal) for receiving the high-voltage electricity applied to the electrical wire 30, and a ground terminal 25 for grounding. The output terminal 21 is connected to a first end 31 of the electrical wire 30 via a cable 36. The receiving terminal 22 is connected to a second end 32 of the electrical wire 30 via a cable 37. The ground terminal 25 is grounded on the ground or the like via a cable 38.

The electrical wire 30 is a conductor to which high-voltage electricity is applied in order to prevent a living organism, such as an animal, from entering the predetermined region. In FIG. 1, the electrical wire 30 is represented only by an arc-like line. In practice, the electrical wire 30 is disposed around the predetermined region. For example, the electrical wire 30 for causing the high-voltage electricity to flow is supported by a fence or the like and constitutes an electric fence.

The electrical wire 30 includes a first end 31 and a second end 32. The first end 31 is connected to the output terminal 21 of the high-voltage power source device 10 via the cable 36. The second end 32 is connected to the receiving terminal 22 of the high-voltage power source device 10 via the cable 37.

The high-voltage electricity output from the output terminal 21 is applied to the electrical wire 30 from the first end 31 of the electrical wire 30 through the cable 36. The high-voltage electricity applied to the electrical wire 30 is transmitted to the second end 32 of the electrical wire 30 and is then received by the receiving terminal 22 through the cable 37.

The high-voltage power source device 10 measures a voltage at the receiving terminal 22 in a circuit formed by the output terminal 21, the receiving terminal 22, and the electrical wire 30, and detects an abnormality in the electrical wire 30.

High-Voltage Power Source Device

Figure 2:
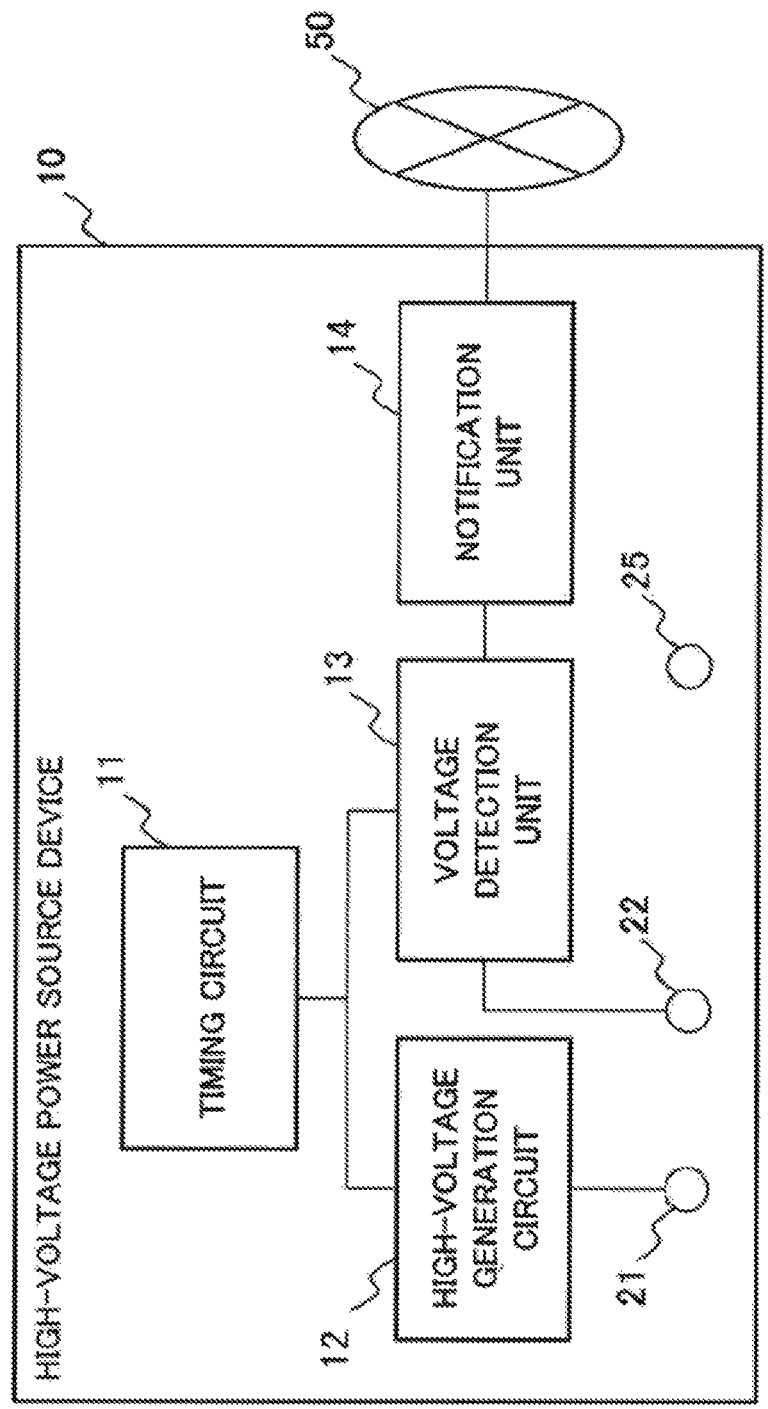
FIG. 2 is a block diagram illustrating a configuration of a high-voltage power source device of a notification system according to the first example embodiment of the present invention.

Next, a detailed configuration of the high-voltage power source device constituting the notification system 1 will be described with reference to the drawings. FIG. 2 is a block diagram illustrating the configuration of the high-voltage power source device 10. As illustrated in FIG. 2, the high-voltage power source device 10 includes a timing circuit 11, a high-voltage generation circuit 12, a voltage detection unit 13 and a notification unit 14. Further, the high-voltage power source device 10 includes the output terminal 21, the receiving terminal 22, and the ground terminal 25. The high-voltage power source device 10 is connected to an external network 50 such as the Internet or a mobile network.

The timing circuit 11 is connected to each of the high-voltage generation circuit 12 and the voltage detection unit 13. The timing circuit 11 instructs the high-voltage generation circuit 12 to generate high-voltage electricity at a timing when high-voltage electricity is generated. Further, the timing circuit 11 sends an instruction for measuring a voltage value of high-voltage electricity at the receiving terminal 22 to the voltage detection unit 13.

The high-voltage generation circuit 12 is connected to the timing circuit 11 and is connected to the output terminal 21. The high-voltage generation circuit 12 generates high-voltage electricity in response to the instruction from the timing circuit 11. The high-voltage generation circuit 12 supplies the generated high-voltage electricity to the output terminal 21. For example, the high-voltage generation circuit 12 generates high-voltage electricity of 5000 V. Note that, the high-voltage electricity generated by the high-voltage generation circuit 12 is not limited to 5000 V, but instead can be set to a desired value.

The voltage detection unit 13 is connected to each of the timing circuit 11 and the notification unit 14, and is connected to the receiving terminal 22. The voltage detection unit 13 measures the voltage of high-voltage electricity at the receiving terminal 22 in response to the instruction from the timing circuit 11, and determines whether an abnormality occurs in the voltage value. Specifically, the voltage detection unit 13 measures the voltage value of high-voltage electricity at the receiving terminal 22, and determines whether an abnormality occurs in the electrical wire 30, based on the measured voltage value. Upon determining that an abnormality occurs in the electrical wire 30, the voltage detection unit 13 outputs a determination result to the notification unit 14.

For example, when the voltage value of high-voltage electricity at the receiving terminal 22 is lower than a predetermined threshold, the voltage detection unit 13 determines that an abnormality occurs in the electrical wire 30. For example, 80% of the voltage value of high-voltage electricity output from the high-voltage generation circuit 12 is set as a threshold for determination. At this time, when the voltage output from the high-voltage generation circuit is 5000 V, 4000 V corresponds to the threshold voltage value. Upon detecting that the voltage value of high-voltage electricity at the receiving terminal 22 falls below 4000 V, the voltage detection unit 13 determines that an abnormality occurs in the electrical wire 30. Note that, the threshold for the voltage value of high-voltage electricity output from the high-voltage generation circuit 12 is not limited to 80%, but instead can be arbitrarily set.

The notification means 14 is connected to the voltage detection unit 13 and is connected to the network 50. Upon receiving a result indicating that the voltage detection unit 13 determines that an abnormality occurs in the electrical wire 30, the notification unit 14 notifies an external device, such as a system treated by an administrator of the electrical wire 30, of the determination result via the network 50. On the other hand, upon receiving a result indicating that the voltage detection unit 13 determines that no abnormality occurs in the electrical wire 30, the notification unit 14 does not output the determination result. Note that a configuration in which the determination result is notified from the notification unit 14 may be employed even during a normal time.

Disconnection

A case where a part of the electrical wire 30 is disconnected will now be described. It is assumed herein that the voltage output from the high-voltage generation circuit 12 is 5000 V, and a threshold for the voltage at which the voltage detection unit 13 determines that an abnormality is present is 4000 V. In other words, when the voltage value of high-voltage electricity at the receiving terminal 22 is less than 4000 V, the voltage detection unit 13 determines that an abnormality is present in the electrical wire 30.

When a middle part of the electrical wire 30 is disconnected, the high-voltage electricity that is output from the high-voltage generation circuit 12 and is applied to the first end 31 of the electrical wire 30 does not reach the second end 32 of the electrical wire 30, and thus the voltage at the second end 32 becomes 0 V. At this time, the voltage at the receiving terminal 22 also becomes 0 V. As a result, since a detected voltage at the receiving terminal 22 is less than 4000 V, the voltage detection unit 13 determines that an abnormality occurs in the electrical wire 30.

The voltage detection unit 13 notifies the notification unit 14 of the determination result indicating that an abnormality occurs in the electrical wire 30. The notification unit 14 notifies the system treated by the administrator of the abnormality via the network 50.

Grounding

Next, a case where a part of the electrical wire 30 is grounded on the ground or the like through a fallen tree or the like is described. It is assumed herein that the voltage output from the high-voltage generation circuit 12 is 5000 V, and a threshold for the voltage at which the voltage detection unit 13 determines that an abnormality occurs is 4000 V. Specifically, when the voltage value of high-voltage electricity at the receiving terminal 22 is less than 4000 V, the voltage detection unit 13 determines that an abnormality occurs in the electrical wire 30.

When a part of the electrical wire 30 is grounded through a fallen tree or the like, the high-voltage electricity that is output from the high-voltage generation circuit 12 and is applied to the electrical wire 30 leaks to the ground at a portion where the electrical wire 30 is grounded. Accordingly, at the portion following the grounded portion, the voltage of the electrical wire 30 is lowered close to 0 V. As a result, since the detected voltage is less than 4000 V, the voltage detection unit 13 determines that an abnormality is present in the electrical wire 30.

The voltage detection unit 13 notifies the notification unit 14 of the determination result indicating that an abnormality occurs in the electrical wire 30. The notification unit 14 notifies the system treated by the administrator of the abnormality via the network 50.

Electrical Leakage

Next, a case where grasses and flowers growing naturally in the vicinity of the electrical wire 30 grow and electrical leakage occurs when the grasses and flowers contact the electrical wire 30. It is assumed herein that the voltage output from the high-voltage generation circuit 12 is 5000 V, and a threshold for the voltage at which the voltage detection unit 13 determines that an abnormality occurs is 4000 V. Specifically, when the voltage value of high-voltage electricity at the receiving terminal 22 is less than 4000 V, the voltage detection unit 13 determines that an abnormality occurs in the electrical wire 30.

Since grasses and flowers are conductors, when the grasses and flowers contact the electrical wire 30, high-voltage electricity leaks through the grasses and flowers, and therefore, the voltage of high-voltage electricity that is output from the high-voltage generation circuit 12 and that is applied to the electrical wire 30 decreases. As a result, a low voltage depending on an amount of electrical leakage reaches the receiving terminal 22. At this time, when the detected voltage is less than 4000 V, the voltage detection unit 13 determines that an abnormality occurs in the electrical wire 30.

The voltage detection unit 13 notifies the notification unit 14 of the determination result indicating that an abnormality occurs in the electrical wire 30. The notification unit 14 notifies the system treated by the administrator via the network.

Figure 3:
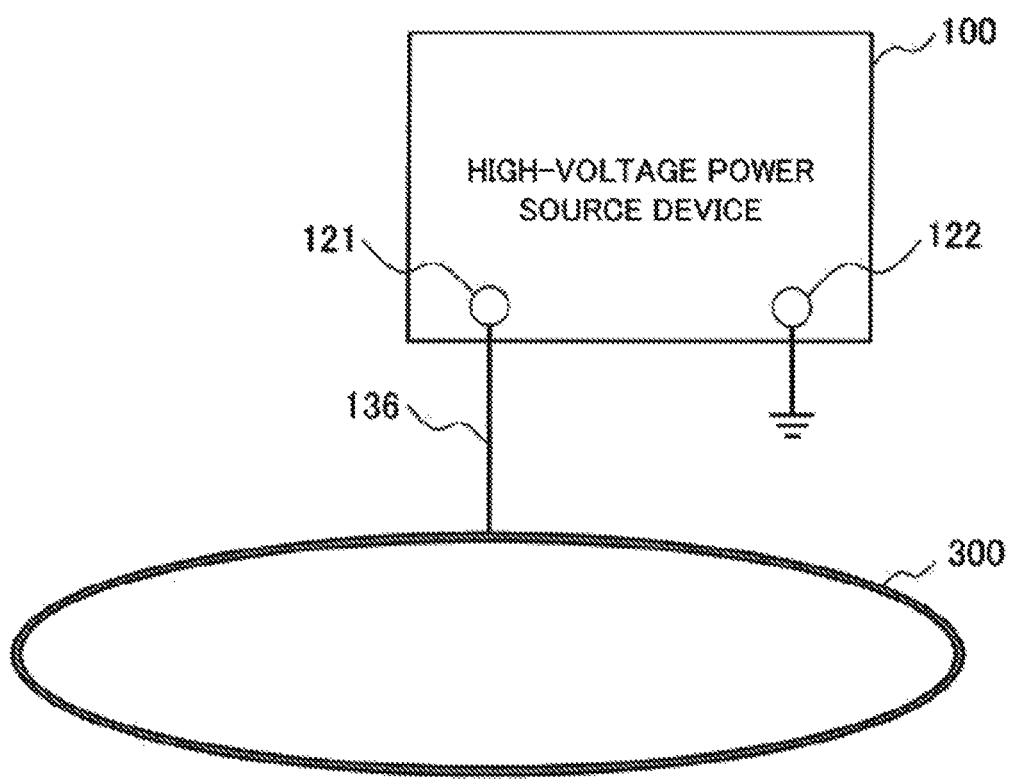
FIG. 3 is a conceptual diagram illustrating a configuration of a general notification system.

FIG. 3 is a conceptual diagram illustrating a configuration of a general notification system. The general notification system includes a high-voltage power source device 100 including an output terminal 121 and a ground terminal 122, and an annular electrical wire 300 having no end. The electrical wire 300 receives a supply of high-voltage electricity from the output terminal 121 of the high-voltage power source device 100.

When an abnormality occurs in a part of the electrical wire 300, the general notification system as illustrated in FIG. 3 includes no receiving terminal, and therefore cannot detect the occurrence of an abnormality in the electrical wire 300.

As described above, the notification system according to this example embodiment includes the receiving terminal in addition to the output terminal for outputting high-voltage electricity. Further, the notification system according to this example embodiment measures the voltage of high-voltage electricity applied to the electrical wire from the output terminal and been returned to the receiving terminal, to thereby detect an abnormality in the electrical wire. In other words, the notification system according to this example embodiment is provided not only with the terminal for outputting a high voltage, but also with the terminal for receiving the high voltage, and measures the high-voltage electricity applied to the electrical wire, to thereby detect an abnormality in the electrical wire.

As a result, the notification method for the notification system according to this example embodiment can detect the status of an abnormality that has occurred in the electrical wire constituting the electric fence or the like, and can notify an external device of the status of the abnormality that has occurred. With this configuration, probability that the administrator overlooks the occurrence of an abnormality in the electric fence is reduced, and opportunities that living organisms, such as boars and deer, enter a predetermined region of the inside of the electrical wire can be reduced.

Second Example Embodiment

Next, a notification system according to a second example embodiment of the present invention will be described with reference to the drawings. The notification system according to this example embodiment analyzes a voltage waveform of high-voltage electricity appearing at an output terminal and a receiving terminal, thereby determining a location of an electrical wire 30 where an abnormality has occurred.

Figure 4:
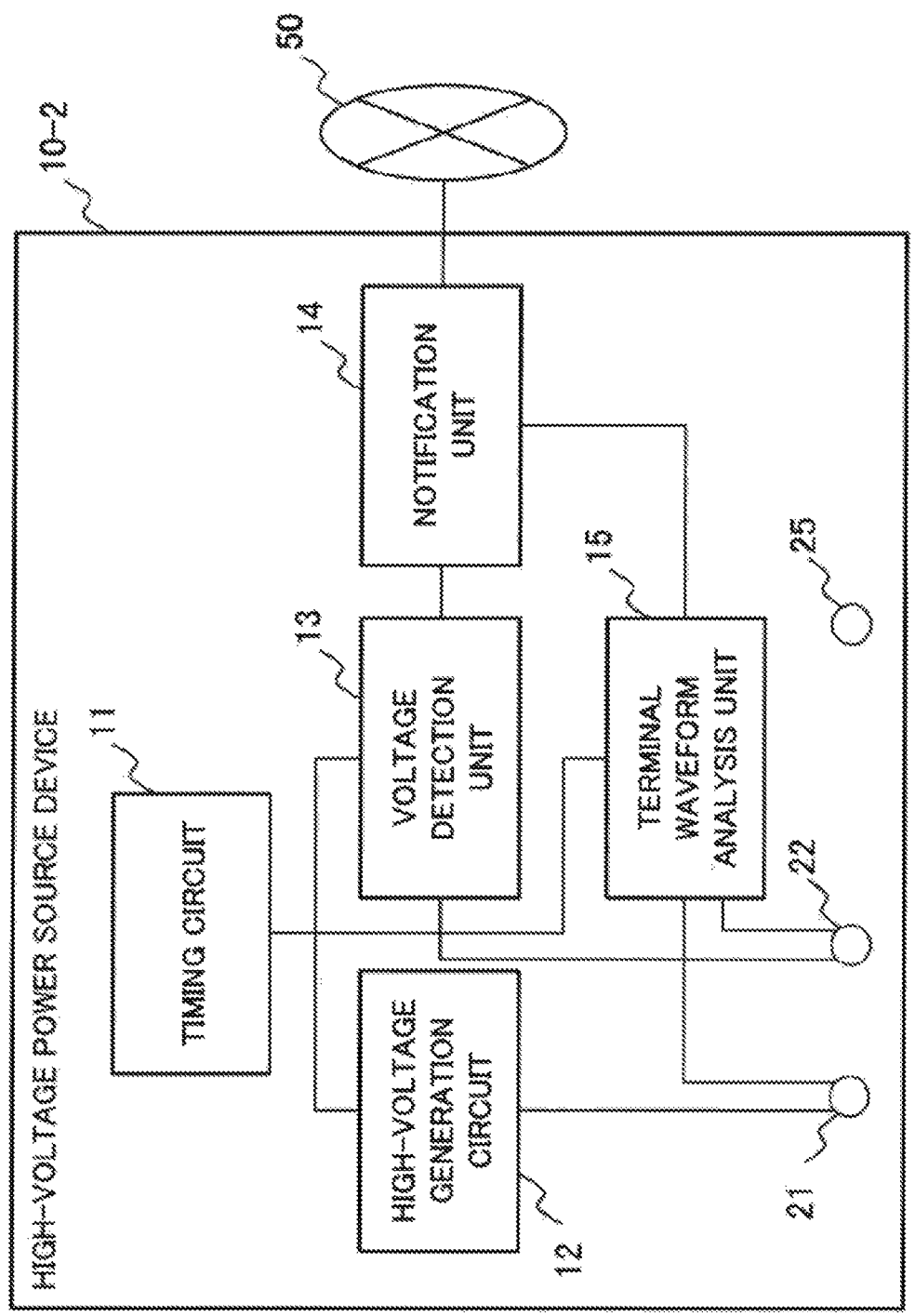
FIG. 4 is a block diagram illustrating a configuration of a high-voltage power source device of a notification system according to a second example embodiment of the present invention.

FIG. 4 is a block diagram illustrating a configuration of a high-voltage power source device 10-2 included in the notification system according to this example embodiment. As illustrated in FIG. 4, the high-voltage power source device 10-2 includes a terminal waveform analysis unit 15, in addition to a timing circuit 11, a high-voltage generation circuit 12, a voltage detection unit 13, a notification unit 14, an output terminal 21, a receiving terminal 22, and a ground terminal 25. In the following, descriptions of components similar to those of the first example embodiment are omitted, and the terminal waveform analysis unit 15 is mainly described.

The terminal waveform analysis unit 15 is connected to each of the timing circuit 11 and the notification unit 14, and is also connected to each of the output terminal 21 and the receiving terminal 22. High-voltage electricity applied to the electrical wire 30 is transmitted to a second end 32 side of the electrical wire 30, and is then input to each of the voltage detection unit 13 and the terminal waveform analysis unit 15 through the receiving terminal 22 via a cable 37.

The terminal waveform analysis unit 15 analyzes a voltage waveform (also referred to as a reflection waveform) at the output terminal 21 and a voltage waveform (also referred to as an input waveform) at the receiving terminal 22. The terminal waveform analysis unit 15 measures a period from a time when the reflection waveform is observed to a time when the input waveform is observed (referred to as a delay period). Further, the terminal waveform analysis unit 15 analyzes a shape of the reflection waveform and a shape of the input waveform. Based on the measured delay period, the terminal waveform analysis unit 15 determines whether an abnormality occurs, and calculates a distance from the output terminal 21 to a location where an abnormality, such as disconnection, grounding, or electrical leakage, has occurred.

The terminal waveform analysis unit 15 measures the delay period for a voltage between the output terminal 21 and the receiving terminal 22. When a disconnection occurs in the electrical wire 30, a reflection is generated at the output terminal 21 due to the disconnection, and a waveform in which the reflection is superimposed on the output waveform appears. The terminal waveform analysis unit 15 analyzes the reflection waveform, calculates a distance from the output terminal 21 to the disconnected portion, and outputs the calculated distance to the notification unit 14. The notification unit 14 notifies a system treated by an administrator of the electrical wire 30 of the calculated distance via a network 50.

When a decrease in voltage is not detected, the voltage detection unit 13 determines a normal time during which disconnection, electrical leakage, or the like does not occur. On the other hand, when a decrease in voltage is detected, the voltage detection unit 13 determines that an abnormality, such as disconnection or electrical leakage, has occurred. The voltage detection unit 13 outputs the determination result to the notification unit 14.

Waveform Analysis

An example for analyzing the reflection waveform measured by the output terminal 21 and the input waveform measured by the receiving terminal 22 will now be described.

Figure 5:
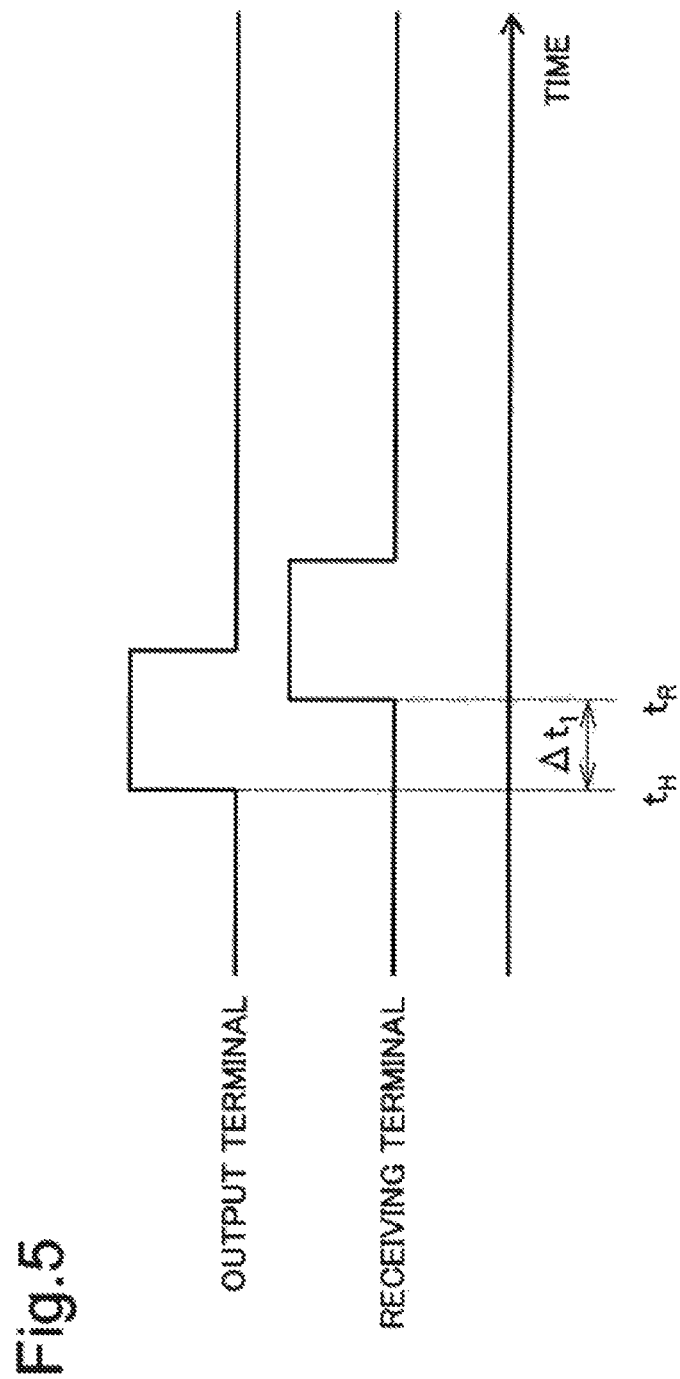
FIG. 5 is a timing chart related to a terminal waveform during a normal time that is analyzed by a terminal waveform analysis unit included in the high-voltage power source device of the notification system according to the second example embodiment of the present invention.
Figure 6:
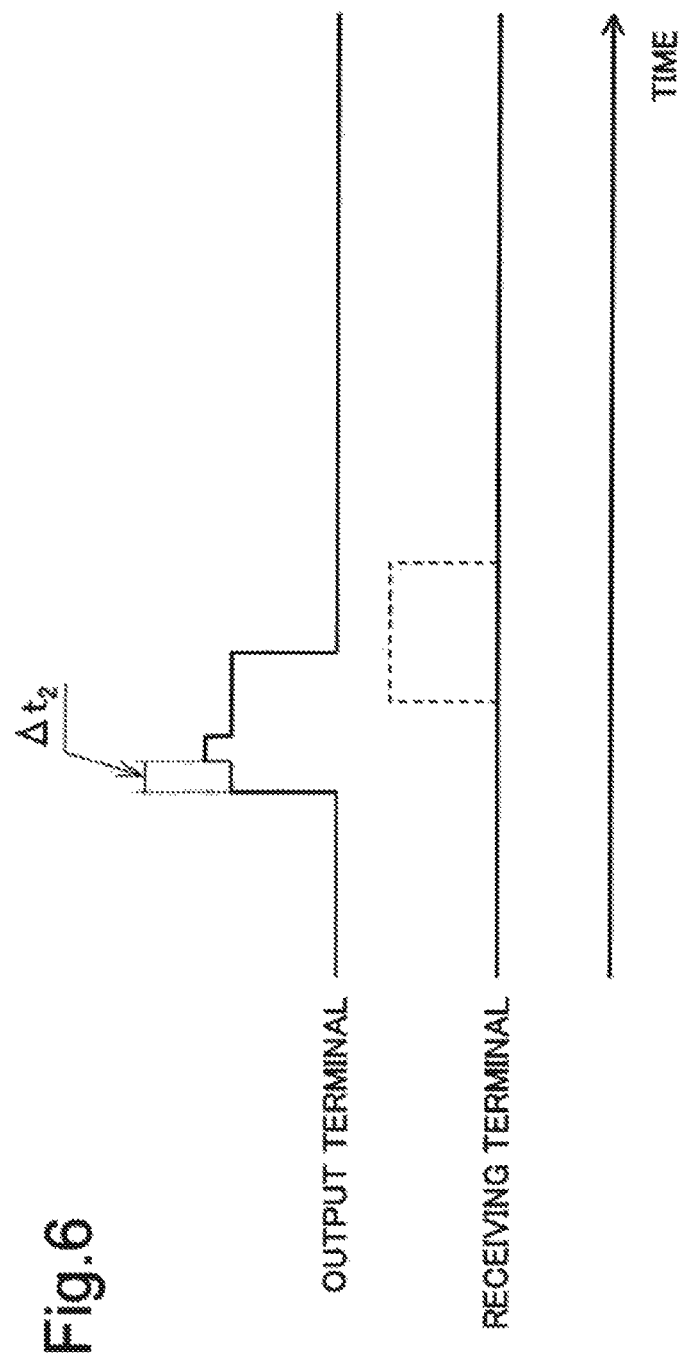
FIG. 6 is a timing chart related to a terminal waveform during disconnection that is analyzed by the terminal waveform analysis unit included in the high-voltage power source device of the notification system according to the second example embodiment of the present invention.
Figure 7:
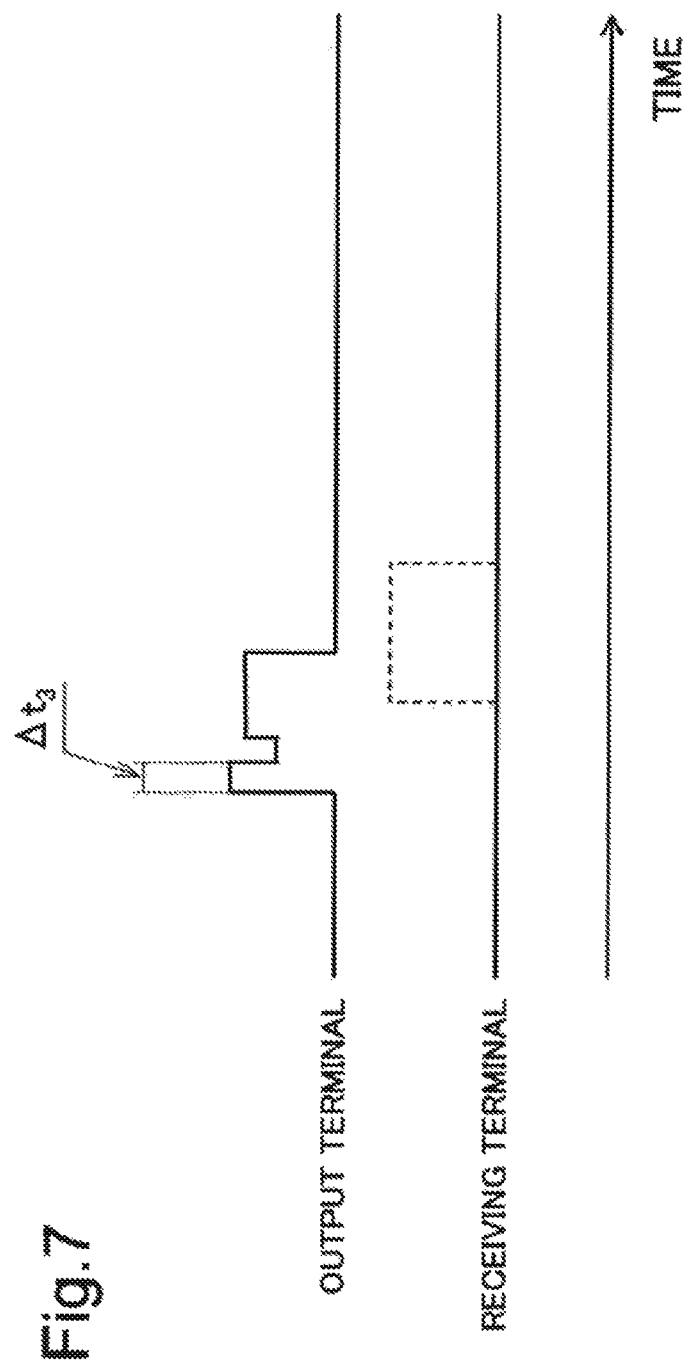
FIG. 7 is a timing chart related to a terminal waveform during electrical leakage that is analyzed by the terminal waveform analysis unit included in the high-voltage power source device of the notification system according to the second example embodiment of the present invention.

FIGS. 5 to 7 each illustrate an example of the voltage waveform observed at each of the output terminal 21 and the receiving terminal 22. In the following description, it is assumed that a characteristic impedance of a circuit formed by the electrical wire 30 is constant and a characteristic impedance at an output side of high-voltage electricity matches a characteristic impedance at a reception side of the high-voltage electricity. In addition, in the following description, it is assumed that a length of the electrical wire 30 is 1000 meters and the delay period generated by the electrical wire 30 during the normal time is four microseconds.

FIG. 5 illustrates a voltage waveform (upper stage) at the output terminal 21 and a voltage waveform (lower stage) at the receiving terminal 22 in a normal state. The high-voltage electricity output from the output terminal 21 is attenuated by an amount corresponding to an electric resistance of the electrical wire 30 and reaches the receiving terminal 22. At this time, in the voltage waveform of high-voltage electricity that reaches the receiving terminal 22, a delay of a delay period $\Delta t1$ is generated depending on the length of the electrical wire 30. In the example of FIG. 5, the delay period $\Delta t1$ is four microseconds.

FIG. 6 is an example of a voltage waveform at the output terminal 21 when a disconnection occurs. When a disconnection occurs in the electrical wire 30, the voltage waveform at the receiving terminal 22 is not detected. On the other hand, since a reflection is generated at the disconnected portion, the voltage waveform at which the voltage temporarily increases is detected at the output terminal 21. A period in which the voltage temporarily increases varies depending on a length of a portion to which high-voltage electricity is applied and a length of the disconnected portion. Specifically, when a period $\Delta t2$ in which the voltage temporarily increases is compared with the delay period $\Delta t1$ during the normal time, the length of the electrical wire 30 from the output terminal 21 to the disconnected portion can be obtained.

In the example of FIG. 6, when the period $\Delta t2$ required for forming a convex step on the output waveform is two microseconds, a period for reaching a position where a disconnection has occurred is one microsecond, which is a half of $\Delta t2$, in consideration of a round-trip time of the voltage. In other words, it can be calculated that the disconnection has occurred at the position of 250 meters which corresponds to one fourths of the length of the electrical wire 30, i.e., 1000 meters.

FIG. 7 illustrates a waveform when a part of the electrical wire 30 is grounded on the ground through a fallen tree or the like. When the electrical wire 30 is grounded, the voltage waveform cannot be detected at the receiving terminal 22. On the other hand, since a reflection is generated at the grounded portion, a waveform at which the voltage temporarily decreases is detected at the output terminal 21. A period in which the voltage temporarily decreases varies depending on the length of the portion to which high-voltage electricity is applied and a length of the grounded portion. Specifically, when a period $\Delta t3$ in which the voltage temporarily decreases is compared with the delay period $\Delta t1$ during the normal time, the length of the electrical wire 30 from the output terminal 21 to the grounded portion can be obtained.

In the example of FIG. 7, when the period $\Delta t3$ required for forming a downward convex step on the output waveform is two microseconds, a period for reaching a position where grounding has occurred is one microsecond, which is a half of the period $\Delta t3$, in consideration of the round-trip time of the voltage. In other words, it can be calculated that grounding has occurred at the position of 250 meters which corresponds to one fourths of the length of the electrical wire 30, i.e., 1000 meters.

Specifically, a sudden voltage change is detected in the voltage waveform of high-voltage electricity at the output terminal 21, the terminal waveform analysis unit 15 calculates a period from a time when the high-voltage electricity is started to be applied to the output terminal 21 to a time when the sudden voltage change is detected. Based on the calculated period, the terminal waveform analysis unit 15 calculates the length of the electrical wire 30 from the output terminal 21 to the location where an abnormality has occurred.

Specifically, when the sudden voltage change detected in the voltage waveform of high-voltage electricity at the output terminal 21 is an increase in voltage, the terminal waveform analysis unit 15 determines that a disconnection has occurred in the electrical wire 30. On the other hand, when the sudden waveform change is a decrease in voltage, the terminal waveform analysis unit 15 determines that the electrical wire 30 is grounded.

As described above, the notification system according to this example embodiment includes the terminal waveform analysis unit that analyze the reflection waveform detected at the output terminal and the voltage input waveform detected at an input terminal when an abnormality, such as disconnection or grounding, occurs in the electrical wire constituting the electric fence. Further, according to this example embodiment, an abnormal location of the electric fence can be identified by analyzing the reflection waveform detected at the output terminal, which enables the administrator to easily find the abnormal location during performing maintenance of the electric fence.

Third Example Embodiment

Next, a notification system according to a third example embodiment of the present invention will be described with reference to the drawings. A high-voltage power source device included in the notification system according to this example embodiment has a function for switching between a terminal for outputting high-voltage electricity and a terminal for receiving the high-voltage electricity.

Figure 8:
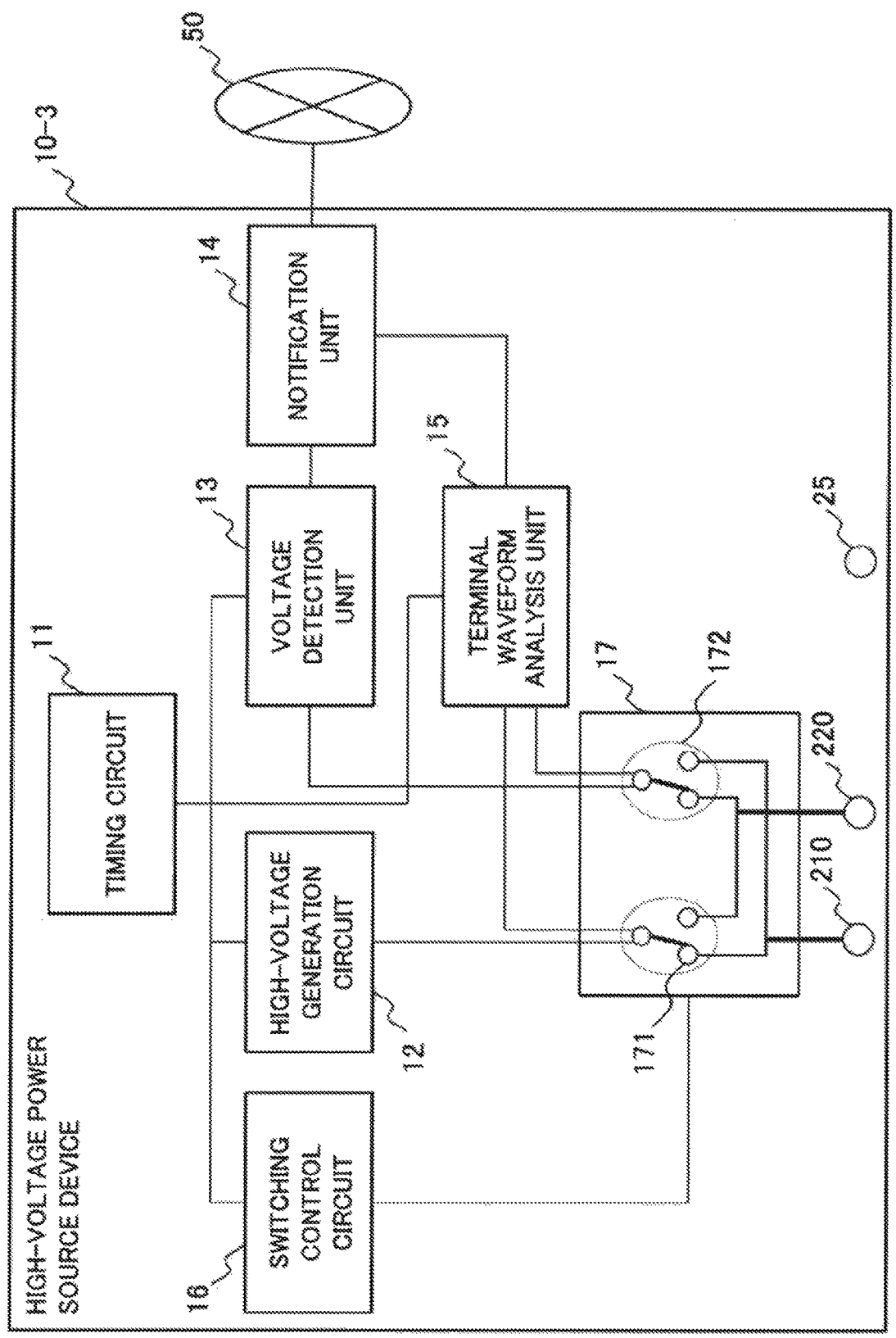
FIG. 8 is a block diagram illustrating a configuration of a high-voltage power source device of a notification system according to a third example embodiment of the present invention.

FIG. 8 is a conceptual diagram illustrating a configuration of a high-voltage power source device 10-3 included in the notification system according to this example embodiment. As illustrated in FIG. 8, the high-voltage power source device 10-3 according to this example embodiment includes a switching control circuit 16 and a switching circuit 17, in addition to a timing circuit 11, a high-voltage generation circuit 12, a voltage detection unit 13, a notification unit 14, a terminal waveform analysis unit 15, and a ground terminal 25. The high-voltage power source device 10-3 according to this example embodiment further includes a first terminal 210 and a second terminal 220 instead of the output terminal 21 and the receiving terminal 22, respectively. In the following, descriptions of components similar to those of the first and second example embodiments are omitted, and the switching control circuit 16 and the switching circuit 17 are mainly described.

The switching control circuit 16 is connected to each of the timing circuit 11 and the switching circuit 17. The switching control circuit 16 controls the switching circuit 17 in response to an instruction from the timing circuit 11. In accordance with the instruction from the timing circuit 11, high-voltage electricity (pulse) generated by the high-voltage generation circuit 12 is output to the first terminal 210 or the second terminal 220 via the switching circuit 17.

The switching circuit 17 is connected to each of the high-voltage generation circuit 12, the voltage detection unit 13, the terminal waveform analysis unit 15, and the switching control circuit 16, and is connected to each of the first terminal 210 and the second terminal 220.

The switching circuit 17 includes a switch 171 and a switch 172. The switch 171 is connected to each of the high-voltage generation circuit 12 and the terminal waveform analysis unit 15, and a terminal to be connected to the high-voltage generation circuit 12 and the terminal waveform analysis unit 15 is switched between the first terminal 210 and the second terminal 220. The switch 172 is connected to each of the voltage detection unit 13 and the terminal waveform analysis unit 15, and a terminal to be connected to the voltage detection unit 13 and the terminal waveform analysis unit 15 is switched between the first terminal 210 and the second terminal 220.

The connection state of the terminal of the switching circuit 17 is executed based on the control of the switching control circuit 16. When an abnormality is detected in the electrical wire 30, the switching control circuit 16 controls the switching circuit 17 by time division in such a way that the high-voltage electricity is supplied also in a direction opposite to that in the connection state during the normal time. For example, the voltage detection unit 13 is configured to send an instruction for switching the terminal from the timing circuit 11 to the switching control circuit 16 when an abnormality is detected in the electrical wire 30, thereby making it possible to switch the switching circuit 17 when an abnormality occurs. In addition, for example, a configuration for sending an instruction for switching to the switching control circuit 16 from a higher-order system that has received an abnormality occurrence notification from the notification unit 14 may be employed.

For example, when a disconnection occurs in a part of the electrical wire 30, the high-voltage electricity is applied between the first terminal 210 and the disconnected location, while the high-voltage electricity is not applied between the disconnected location and the second terminal 220. At this time, between the disconnected location and the second terminal 220, an electrical shock cannot be given even when a living organism touches the electrical wire 30, and an abnormality notification is also not issued. This makes it difficult to prevent the living organism from entering a predetermined region.

When an abnormality occurs in the electrical wire 30, the switching control circuit 16 operates the switching circuit 17 to control the application of the high-voltage electricity also from the second terminal 220. Incidentally, by only switching the supply source of the high-voltage electricity to the second terminal 220, no high-voltage electricity is applied between the first terminal 210 and the disconnected location. Accordingly, it is desirable that the switching control circuit 16 controls the switching circuit 17 in such a manner that the terminal for outputting the high-voltage electricity generated by the high-voltage generation circuit 12 is alternately switched between the first terminal 210 and the second terminal 220. A timing for switching between the first terminal 210 and the second terminal 220 may be set every predetermined time, or may be set at any time intervals.

Figure 9:
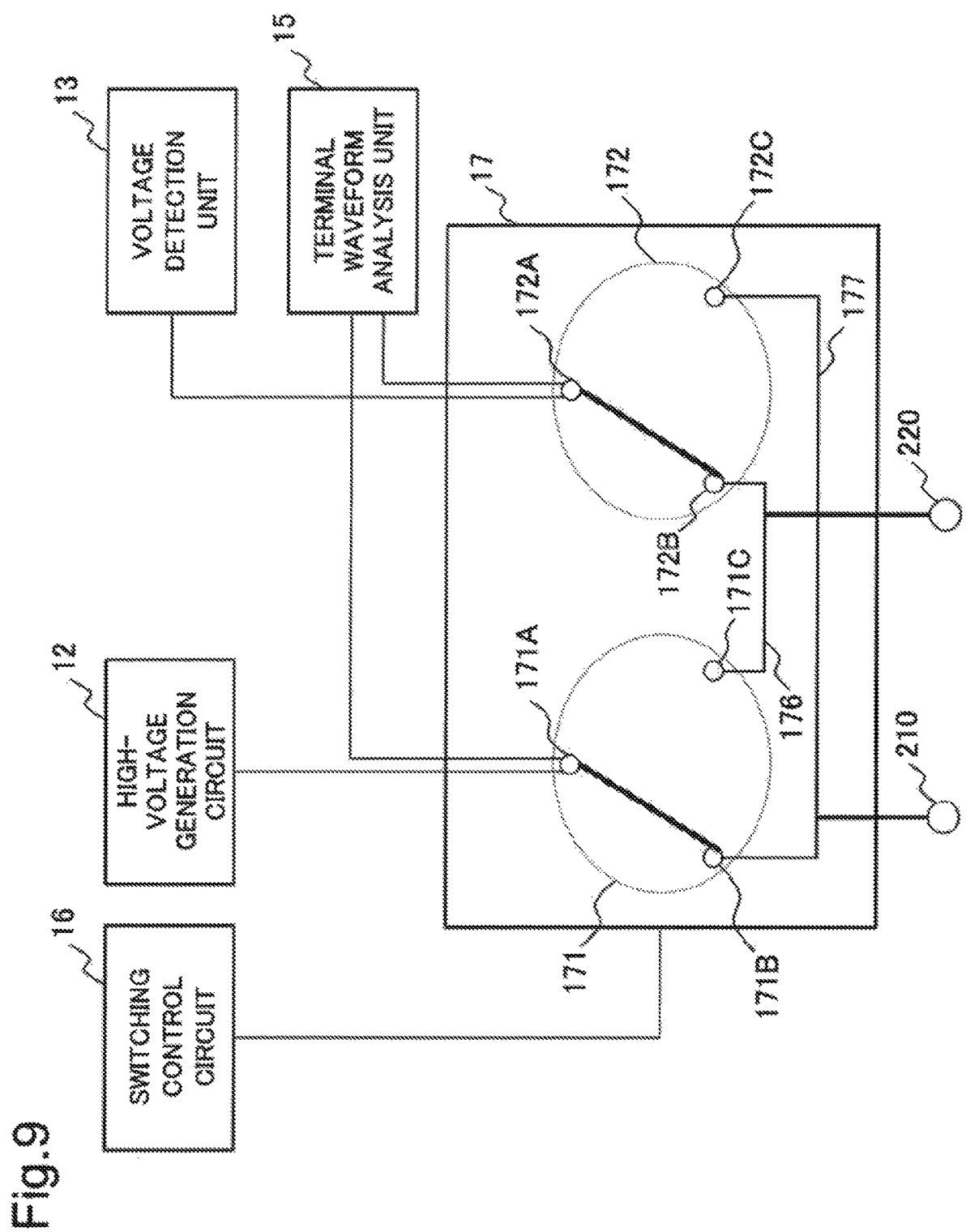
FIG. 9 is a conceptual diagram related to switching of a switching circuit included in the high-voltage power source device of the notification system according to the third example embodiment of the present invention.
Figure 10:
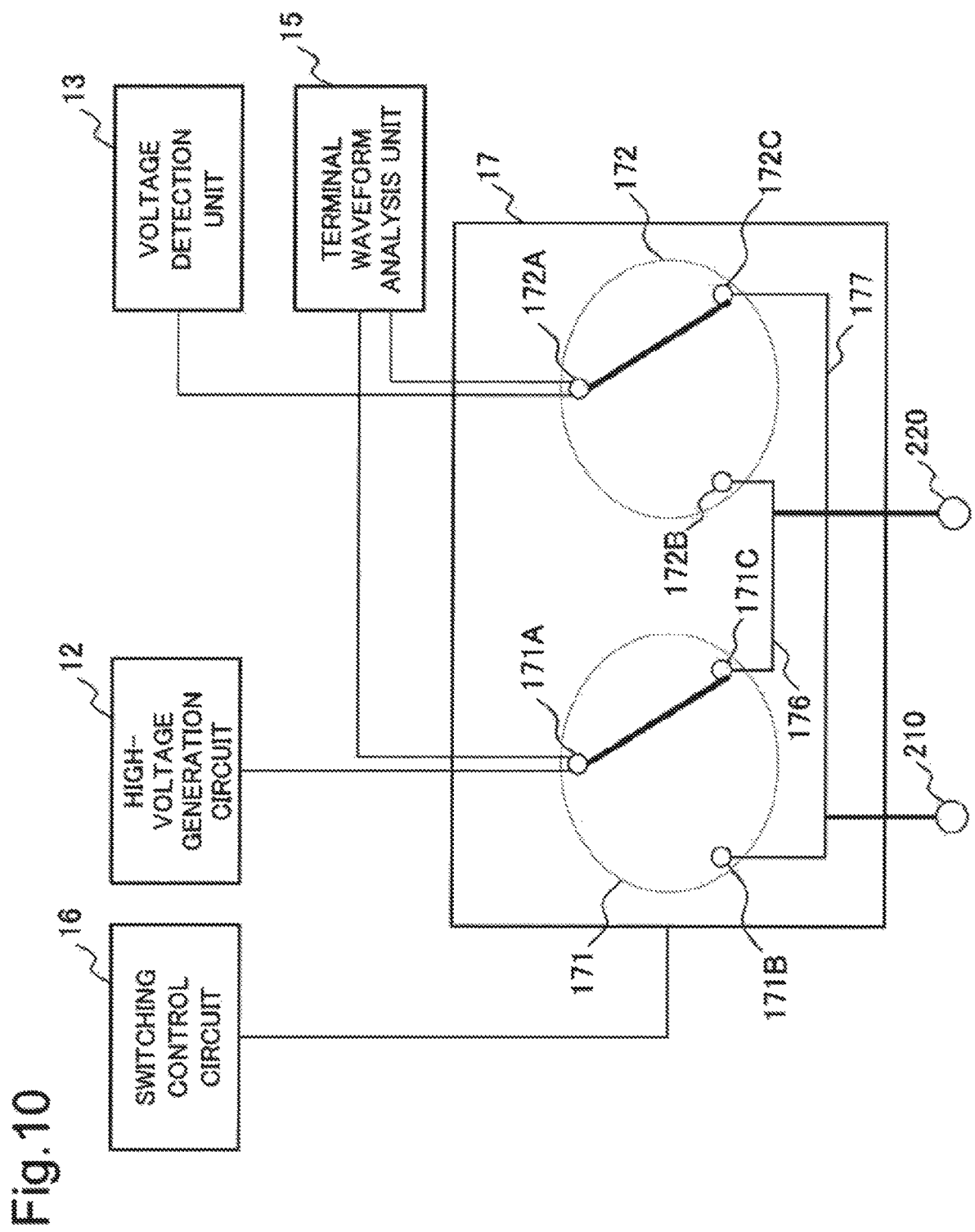
FIG. 10 is a conceptual diagram related to switching of the switching circuit included in the high-voltage power source device of the notification system according to the third example embodiment of the present invention.

FIGS. 9 and 10 are conceptual diagrams for each illustrating switching between the switch 171 and the switch 172 included in the switching circuit 17.

FIG. 9 illustrates a first connection state in which the high-voltage generation circuit 12 and the terminal waveform analysis unit 15 are each connected to the first terminal 210, and the voltage detection unit 13 and the terminal waveform analysis unit 15 are each connected to the second terminal 220. FIG. 10 illustrates a second connection state in which the high-voltage generation circuit 12 and the terminal waveform analysis unit 15 are each connected to the second terminal 220, and the voltage detection unit 13 and the terminal waveform analysis unit 15 are each connected to the first terminal 210. The following description is made assuming that the first connection state (FIG. 9) is selected during the normal time and the first connection state (FIG. 9) and the second connection state (FIG. 10) are alternately switched when an abnormality occurs.

The switch 171 includes three terminals, i.e., a terminal 171A, a terminal 171B, and a terminal 171C. The terminal 171A is connected to one of the terminal 171B and the terminal 171C. Further, the switch 172 includes three terminals, i.e., a terminal 172A, a terminal 172B, and a terminal 172C. The terminal 172A is connected to one of the terminal 172B and the terminal 172C.

The terminal 171C of the switch 171 and the terminal 172B of the switch 172 are connected to each other with a wire 176. The wire 176 is connected to the second terminal 220. Further, the terminal 171B of the switch 171 and the terminal 172C of the switch 171 are connected to each other with a wire 177. The wire 177 is connected to the first terminal 210.

The terminal 171A is connected to each of the high-voltage generation circuit 12 and the terminal waveform analysis unit 15. The terminal 171B is connected to the first terminal 210 via the wire 177. The terminal 171C is connected to the second terminal 220 via the wire 176.

The terminal 172A is connected to each of the voltage detection unit 13 and the terminal waveform analysis unit 15. The terminal 172B is connected to the second terminal 220 via the wire 176. The terminal 172C is connected to the first terminal 210 via the wire 177.

The terminal to be connected to the terminal 171A and the terminal 172A is synchronously switched based on the control of the switching control circuit 16.

As illustrated in FIG. 9, when the terminal 171A is connected to the terminal 171B, the terminal 172A is connected to the terminal 172B. At this time, the switching circuit 17 takes the first connection state in which the high-voltage generation circuit 12 is connected to the first terminal 210, the terminal waveform analysis unit 15 is connected to each of the first terminal 210 and the second terminal 220, and the voltage detection unit 13 is connected to the second terminal 220.

On the other hand, as illustrated in FIG. 10, when the terminal 171A is connected to the terminal 171C, the terminal 172A is connected to the terminal 172C. At this time, the switching circuit 17 takes the second connection state in which the high-voltage generation circuit 12 is connected to the second terminal 220, the terminal waveform analysis unit 15 is connected to each of the first terminal 210 and the second terminal 220, and the voltage detection unit 13 is connected to the first terminal 210.

During the normal time (FIG. 9), the high-voltage electricity generated by the high-voltage generation circuit 12 is output to the electrical wire 30 from a side of the first terminal 210, passes through the electrical wire 30, and is received by the high-voltage power source device 10-3 at a side of the second terminal 220. At this time, the high-voltage electricity received from the second terminal 220 is input to each to the voltage detection unit 13 and the terminal waveform analysis unit 15 through the switching circuit 17.

Incidentally, when a disconnection occurs in the electrical wire 30, the high-voltage electricity output from the high-voltage generation circuit 12 does not reach a second end 32 of the electrical wire 30, and thus the voltage at the second end 32 and the second terminal 220 turns to be 0 V.

Further, when a part of the electrical wire 30 is grounded through a fallen tree or the like, electricity leaks to the ground through the grounded portion. Accordingly, the voltage of the electrical wire 30 decreases to a voltage close to 0 V. Therefore, even when a part of the electrical wire 30 is grounded, the high-voltage electricity does not reach the second end 32 of the electrical wire 30, and thus the voltage at the second end 32 and the second terminal 220 turns to be 0 V.

Further, when grasses and flowers grown naturally in the vicinity of the electrical wire 30 contact the electrical wire 30 and the electrical wire 30 is grounded, the high-voltage electricity leaks to the ground through the grasses and flowers which serve as conductors, whereby the voltage of the electrical wire 30 decreases. As a result, the voltage at the second terminal 220 decreases depending on an amount of electrical leakage.

Specifically, in any of the cases described above, the voltage value detected by the voltage detection unit 13 is less than a threshold (4000 V), and thus the voltage detection unit 13 detects the occurrence of an abnormality in the electrical wire 30. The terminal waveform analysis unit 15 analyzes the terminal waveform, and calculates the length of the electrical wire 30 from the first terminal 210 to the disconnected location.

The notification unit 14 notifies a higher-order system or the like of an abnormality via the network 50, and notifies how far the location where the abnormality has occurred is from the first terminal 210.

This example embodiment has the following features in addition to the features of the first and second example embodiments. In other words, according to this example embodiment, the terminal for outputting the high-voltage electricity is switched, thereby making it possible to switch a direction in which the high-voltage electricity to be applied to the electrical wire constituting the electric fence is supplied. Therefore, according to this example embodiment, when an abnormality, such as disconnection or grounding, occurs in the electric fence, the direction of supplying the high voltage is switched by time division, thereby making it possible to reduce locations to which the high-voltage electricity is applied due to the abnormality. As a result, even when an abnormality occurs in the electric fence, it is possible to prevent a living organism from entering a predetermined region.

Fourth Example Embodiment

Next, a notification system according to a fourth example embodiment of the present invention will be described with reference to the drawings. This example embodiment differs from the notification system according to each of the first to third example embodiments in that terminals are also provided at locations other than both ends of the electrical wire. In this example embodiment, two or more terminals for outputting high-voltage electricity are provided to detect an abnormality in a plurality of circuits formed each by the electrical wire. Note that in the following description, descriptions of components inside a high-voltage power source device, such as a timing circuit, a high-voltage generation circuit, a voltage detection unit, a notification unit, a terminal waveform analysis unit, a switching control circuit, and a switching circuit are omitted.

Figure 11:
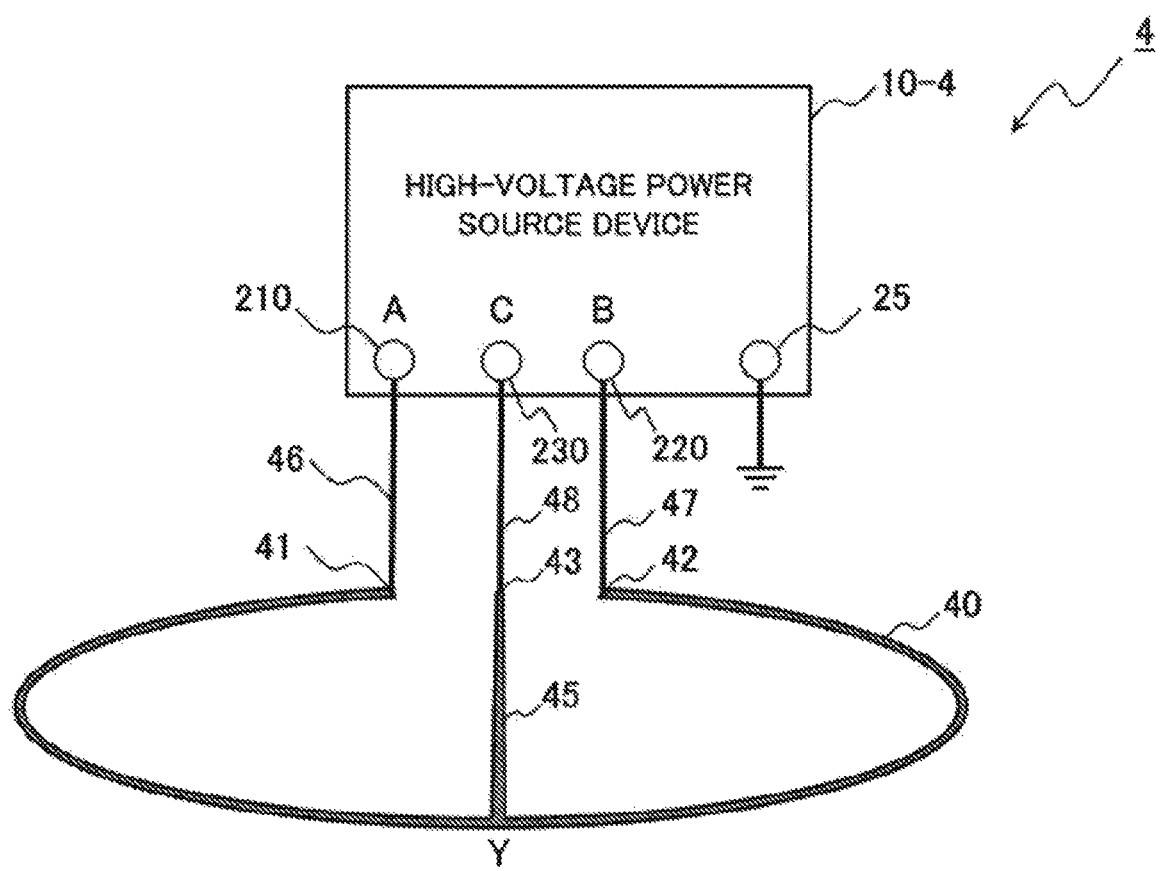
FIG. 11 is a conceptual diagram illustrating a configuration of a notification system according to a fourth example embodiment of the present invention.

FIG. 11 is a conceptual diagram illustrating a configuration of a notification system 4 according to this example embodiment. The notification system 4 according to this example embodiment includes an electrical wire 40 including three or more ends for outputting and receiving high-voltage electricity, and a high-voltage power source device 10-4 for applying high-voltage electricity to the electrical wire 40.

The electrical wire 40 includes a third end 43, in addition to a first end 41 and a second end 42. The third end 43 is electrically connected to the electrical wire 40 via an electrical wire 45 that is connected to a node Y between the first end 41 and the second end 42.

The high-voltage power source device 10-4 includes a third terminal 230 (hereinafter, referred to as a terminal C), in addition to a first terminal 210 (hereinafter, referred to as a terminal A) and a second terminal 220 (hereinafter, referred to as a terminal B). In the example of FIG. 11, the terminal A is connected to the first end 41 via a cable 46, the terminal B is connected to the second end 42 via a cable 47, and the terminal C is connected to the third end 43 via a cable 48.

In other words, in the example of FIG. 11, the electrical wire 40 and the electrical wire 45 are star-connected based on the node Y, and AY, BY, and CY are connected to the terminal A, the terminal B, and the terminal C, respectively.

Switching Control

A change in connection state due to switching control of the terminal A, the terminal B, and the terminal C will now be described by using FIGS. 12 to 14.

FIG. 12 is a table illustrating states of the terminal A, the terminal B, and the terminal C in FIG. 11 in chronological order (times 1 to 9). In the table of FIG. 12, "H" represents a state where high-voltage electricity is output, and "R" represents a state where high-voltage electricity is received. In the example of FIG. 12, among the terminal A, the terminal B, and the terminal C, two terminals are used for outputting the high-voltage electricity and one terminal is used for receiving the high-voltage electricity.

In the table of FIG. 12, the state transitions to time 1, time 2, and time 3 in this order. It is assumed that at time 2 and time 3, voltages at the terminal A and the terminal B are accurately detected, and at time 1, the voltage at the terminal C is not detected. In this case, it can be determined that a disconnection has occurred between C and Y. Similarly, it is assumed that at time 1 and time 3, the voltages at the terminal B and the terminal C are accurately detected, and at time 2, the voltage at the terminal A is not detected. In this case, it can be determined that a disconnection has occurred between A and Y.

In the example of FIG. 12, a state 1 in which the terminal A and the terminal B are output terminals and the terminal C is a receiving terminal, a state 2 in which the terminal B and the terminal C are output terminals and the terminal A is a receiving terminal, and a state 3 in which the terminal A and the terminal C are output terminals and the terminal B is a receiving terminal are caused to transition in order.

FIG. 13 is a table illustrating states of the terminal A, the terminal B, and the terminal C in FIG. 11 in chronological order (times 1 to 9). In the table of FIG. 13, "H" represents the state where high-voltage electricity is output, "R" represents the state where high-voltage electricity is received, and "–" represents a state where high-voltage electricity is neither output nor received. In the example of FIG. 13, one terminal is used for outputting the high-voltage electricity, another one terminal is used for receiving the high-voltage electricity, and the other one terminal is set to open.

In FIG. 13, it is assumed that the state transitions in the order of time 1, time 2, and time 3, at time 2 and time 3, the voltages at the terminal A and the terminal C cannot be accurately detected, and at time 1, the reception at the terminal B can be detected. In this case, it can be determined that a disconnection has occurred between C and Y. Similarly, it is assumed that at time 1 and time 3, the voltages at the terminal B and the terminal C cannot be accurately detected, and at time 2, the voltage at the terminal C can be detected. In this case, it can be determined that a disconnection has occurred between A and Y.

In the example of FIG. 13, a state 1 in which the terminal A is an output terminal, the terminal B is a receiving terminal, and the terminal C is open, a state 2 in which the terminal A is open, the terminal B is an output terminal, and the terminal C is a receiving terminal, and a state 3 in which the terminal A is a receiving terminal, the terminal B is open, and the terminal C is an output terminal are caused to transition in order.

FIG. 14 is a table illustrating states of the terminal A, the terminal B, and the terminal C in FIG. 11 in chronological order (times 1 to 9). In the table of FIG. 14, "H" represents the state where high-voltage electricity is output, and "R" represents the state where high-voltage electricity is received. In the example of FIG. 14, one terminal is used for outputting the high-voltage electricity and two terminals are used for receiving the high-voltage electricity.

In FIG. 14, it is assumed that the state transitions in the order of time 1, time 2, and time 3, at time 1, the voltages at the terminal B and the terminal C are not detected, at time 2, the voltage at the terminal A is not detected, and the voltage at the terminal C is detected. In this case, it can be determined that a disconnection has occurred between A and Y. Further, in a case where at time 1, the voltage at the terminal B is detected and the voltage at the terminal C is not detected, it can be determined that a disconnection has occurred between C and Y. Similarly, in a case where at time 1, the voltage at the terminal B is not detected and the voltage at the terminal C is detected, it can be determined that a disconnection has occurred between B and Y.

In the example of FIG. 14, a state 1 in which the terminal A is an output terminal and the terminal B and the terminal C are receiving terminals, a state 2 in which the terminal B is an output terminal and the terminal A and the terminal C are receiving terminals, and a state 3 in which the terminal C is an output terminal and the terminal A and the terminal B are receiving terminals are caused to transition in order.

As described above, in this example embodiment, three or more terminals capable of outputting high-voltage electricity are provided, and the terminals for outputting high-voltage electricity are configured to be switched. Consequently, according to this example embodiment, it is possible to detect an abnormality in the electrical wire constituting a plurality of circuits.

Hardware

Figure 15:
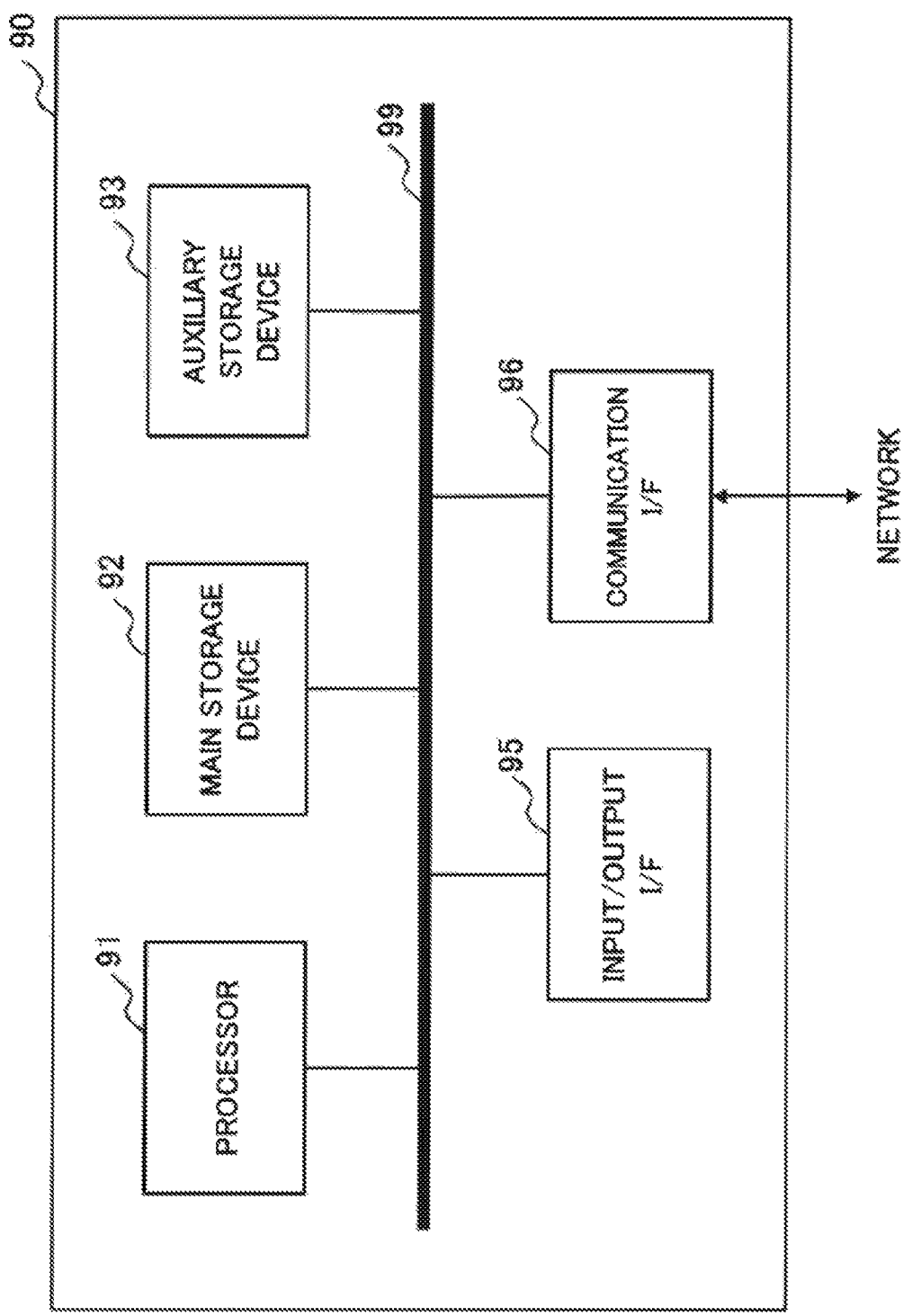
FIG. 15 is a conceptual diagram illustrating an example of hardware for implementing a control system of the high-voltage power source device of the notification system according to each example embodiment of the present invention.

Here, as for a hardware configuration for implementing the control system of the high-voltage power source device according to this example embodiment, description will be made by taking a computer 90 in FIG. 15 as one example. Note that the computer 90 in FIG. 15 is a configuration example for implementing the control system of the high-voltage power source device according to each example embodiment, and thus is not intended to limit the scope of the present invention. For example, the computer 90 is implemented in the form of a microcomputer or the like.

As illustrated in FIG. 15, the computer 90 includes a processor 91, a main storage device 92, an auxiliary storage device 93, an input/output interface 95, and a communication interface 96. In FIG. 15, an interface is abbreviated as I/F. The processor 91, the main storage device 92, the auxiliary storage device 93, the input/output interface 95, and the communication interface 96 are connected to each other via a bus 99 in such a way that they can communicate data. Further, the processor 91, the main storage device 92, the auxiliary storage device 93, and the input/output interface 95 are connected to a network, such as the Internet or an intranet, via the communication interface 96.

The processor 91 loads a program stored in the auxiliary storage device 93 or the like into the main storage device 92, and executes the loaded programs. In this example embodiment, a configuration in which software programs installed in the computer 90 are used may be employed. The processor 91 executes arithmetic processing and control processing to be executed by the control system of the high-voltage power source device according to this example embodiment.

The main storage device 92 includes an area in which programs are loaded. For example, the main storage device 92 may be a volatile memory such as a Dynamic Random Access Memory (DRAM). In addition, a non-volatile memory such as a Magnetoresistive Random Access Memory (MRAM) may be configured or added as the main storage device 92.

The auxiliary storage device 93 is a means for storing various data. The auxiliary storage device 93 is configured by using a local disk such as a hard disk or a flash memory. Note that a configuration in which various data are stored in the main storage device 92 can be employed, and the auxiliary storage device 93 can be omitted.

The input/output interface 95 is a device that connects the computer 90 to peripheral devices, based on connection standards for the computer 90 and the peripheral devices. The communication interface 96 is an interface for connecting to a network, such as the Internet or an intranet, based on standards and specifications. The input/output interface 95 and the communication interface 96 may be commonly used as an interface for connecting to an external device.

The computer 90 may be configured to be connectable to input devices, such as a keyboard, a mouse, and a touch panel, as needed. These input devices are used for inputting information or settings. Note that in a case of using a touch panel as the input device, a configuration in which a display screen of a display device also functions as an interface for the input device may be employed. The input/output interface 95 may intermediate data communication between the processor 91 and each of the input devices.

The communication interface 96 is connected to an external system or a device via a network.

Further, the computer 90 may be provided with a display device for displaying information. In the case where the computer 90 is provided with a display device, the computer 90 may include a display control device (not illustrated) for controlling a display of the display device. The display device may be connected to the computer 90 via the input/output interface 95.

Further, the computer 90 may be provided a reader/writer, as needed. The reader/writer is connected to the bus 99. The reader/writer intermediates reading of data/programs from a recording medium (program recording medium) which is not illustrated and writing of processing results of the computer 90 into the recording medium between the processor 91 and the recording medium. The recording medium can be implemented by using, for example, a semiconductor recording medium such as a Universal Serial Bus (USB) memory or a Secure Digital (SD) card. The recording medium may also be implemented by using a magnetic recording medium, such as a flexible disk, an optical recording medium, such as a Compact Disk (CD) or a Digital Versatile Disc (DVD), or other recording media.

An example of the hardware configuration that enables the control system of the high-voltage power source device according to each of the example embodiments of the present invention has been described above. Note that the hardware configuration illustrated in FIG. 15 is an example of the hardware configuration that enables the control system of the high-voltage power source device according to this example embodiment, and thus is not intended to limit the scope of the present invention. Further, a program for causing a computer to execute processing related to the control system of the high-voltage power source device according to this example embodiment is also included in the scope of the present invention. Furthermore, a program recording medium recording the program according to each example embodiment of the present invention is also included in the scope of the present invention.

While the present invention has been described above with reference to the example embodiments, the present invention is not limited to the above-described example embodiments. The configurations and details of the present invention can be modified in various ways that can be understood by those skilled in the art within the scope of the present invention.

This application is based upon and claims the benefit of priority from Japanese Patent Application No. 2016-241440, filed on Dec. 13, 2016, the disclosure of which is incorporated herein in its entirety by reference.

REFERENCE SIGNS LIST 1, 4 Notification system
10 High-voltage power source device
11 Timing circuit
12 High-voltage generation circuit
13 Voltage detection unit
14 Notification unit
15 Terminal waveform analysis unit
16 Switching control circuit
17 Switching circuit
21 terminal
22 Receiving terminal
25 Ground terminal
30 Electrical wire
31 First end
32 Second end
36, 37, 38 Cable
40 Electrical wire
41 First end
42 Second end
43 Third end
46, 47, 48 Cable
100 High-voltage power source device
210 First terminal
220 Second terminal
230 Third terminal

What is claimed is:
1. A high-voltage power source device comprising:
a first terminal connected to a first end of an electrical wire disposed around a predetermined region;
a second terminal connected to a second end of the electrical wire;
a high-voltage generation circuit configured to generate high-voltage electricity, the high-voltage generation circuit being connected to the first terminal;
a voltage detection circuit configured to measure a voltage value of the high-voltage electricity at the second terminal, and determining whether an abnormality is present in the electrical wire, based on a measured voltage value, the voltage detection circuit being connected to the second terminal;
a timing circuit configured to instruct the high-voltage generation circuit to generate the high-voltage electricity at a timing when the high-voltage electricity is generated, and send an instruction to measure a voltage value of the high-voltage electricity at the second terminal to the voltage detection circuit; and a notification circuit configured to notify an external device of a determination result of the voltage detection circuit.

2. The high-voltage power source device according to claim 1, wherein
the voltage detection circuit
determines that an abnormality occurs in the electrical wire in a case where a voltage value of the high-voltage electricity at the second terminal is lower than a predetermined threshold.

3. The high-voltage power source device according to claim 2, further comprising a terminal waveform analysis circuit configured to analyze a voltage waveform of the high-voltage electricity at each of the first terminal and the second terminal, the terminal waveform analysis circuit being connected to each of the first terminal and the second terminal.

4. The high-voltage power source device according to claim 3, wherein
the terminal waveform analysis circuit
calculates a temporal difference between a time when a voltage waveform of the high-voltage electricity at the first terminal is detected and a time when a voltage waveform of the high-voltage electricity at the second terminal is detected, and
detects whether an abnormality occurs in the electrical wire.

5. The high-voltage power source device according to claim 3, wherein
the terminal waveform analysis circuit
calculates, when detecting a sudden voltage change in a voltage waveform of the high-voltage electricity at the first terminal, a period from a time when the high-voltage electricity is started to be applied to the first terminal till a time when the sudden voltage change is detected, and calculates, based on a calculated period, a length of the electrical wire from the first terminal to a location where an abnormality occurs.

6. The high-voltage power source device according to claim 5, wherein
the terminal waveform analysis circuit
determines that the electrical wire is disconnected in a case where the sudden voltage change detected in a voltage waveform of the high-voltage electricity at the first terminal is an increase in voltage, and
determines that the electrical wire is grounded in a case where the sudden voltage change is a decrease in voltage.

7. The high-voltage power source device according to claim 1, further comprising:
a switching circuit configured to switch a terminal for outputting the high-voltage electricity generated by the high-voltage generation circuit, between the first terminal and the second terminal; and
a switching control circuit configured to control the switching circuit in such a way that, in a case where the voltage detection circuit determines that an abnormality is present in the electrical wire, a terminal for outputting the high-voltage electricity generated by the high-voltage generation circuit is alternately switched between the first terminal and the second terminal.

8. The high-voltage power source device according to claim 7, further comprising
a third terminal connected to a location other than an end of the electrical wire, wherein
the switching control circuit
controls the switching circuit, in a case where the voltage detection circuit determines that an abnormality occurs in the electrical wire, in such a way as to switch a terminal for outputting the high-voltage electricity generated by the high-voltage generation circuit among the first terminal, the second terminal, and the third terminal, and
the switching circuit
switches a terminal for outputting the high-voltage electricity generated by the high-voltage generation circuit among the first terminal, the second terminal, and the third terminal.

9. A notification system comprising:
the high-voltage power source device according to claim 1; and
the electrical wire.

10. A notification method comprising:
instructing, by a timing circuit, a high-voltage generation circuit to generate high-voltage electricity at a timing when the high-voltage electricity is generated,
applying, by the high voltage generation circuit, the high-voltage electricity from a first terminal side connected to a first end of an electrical wire disposed around a predetermined region;
sending, by the timing circuit, an instruction to measure a voltage value of the high-voltage electricity at the second terminal to a voltage detection circuit
measuring, by the voltage detection circuit, a voltage value of the high-voltage electricity at a second terminal connected to a second end of the electrical wire;
determining, by the voltage detection circuit, whether an abnormality is present in the electrical wire, based on a measured voltage value measured at the second terminal; and
notifying, by the voltage detection circuit, an external device of a determination result of the determining.

* * * * *